US011721766B2

(12) United States Patent
Le et al.

(10) Patent No.: US 11,721,766 B2
(45) Date of Patent: Aug. 8, 2023

(54) METAL-ASSISTED SINGLE CRYSTAL TRANSISTORS

(71) Applicant: Intel Corporation, Santa Clara, CA (US)

(72) Inventors: Van H. Le, Beaverton, OR (US); Ashish Agrawal, Hillsboro, OR (US); Seung Hoon Sung, Portland, OR (US); Abhishek A. Sharma, Hillsboro, OR (US); Ravi Pillarisetty, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 17/701,232

(22) Filed: Mar. 22, 2022

(65) Prior Publication Data
US 2022/0216347 A1    Jul. 7, 2022

Related U.S. Application Data

(62) Division of application No. 16/648,974, filed as application No. PCT/US2017/068993 on Dec. 29, 2017, now Pat. No. 11,322,620.

(51) Int. Cl.
*H01L 29/786*    (2006.01)
*C30B 29/08*    (2006.01)
(Continued)

(52) U.S. Cl.
CPC ........ *H01L 29/78654* (2013.01); *C30B 29/08* (2013.01); *C30B 29/40* (2013.01); *H01L 27/088* (2013.01)

(58) Field of Classification Search
CPC .......... H01L 29/0847; H01L 29/41783; H01L 29/785; H01L 29/78642; H01L 29/78;
(Continued)

(56) References Cited

U.S. PATENT DOCUMENTS 9,178,058 B2    11/2015   Chen et al.
2013/0105898 A1    5/2013   Wang et al.
(Continued)

OTHER PUBLICATIONS

International Search Report and Written Opinion for International Patent Application No. PCT/US2017/068993 dated Sep. 28, 2018, 15 pgs.
(Continued)

*Primary Examiner* — Jaehwan Oh
(74) *Attorney, Agent, or Firm* — Schwabe, Williamson & Wyatt, P.C.

(57) ABSTRACT

Described herein are apparatuses, systems, and methods associated with metal-assisted transistors. A single crystal semiconductor material may be seeded from a metal. The single crystal semiconductor material may form a channel region, a source, region, and/or a drain region of the transistor. The metal may form the source contact or drain contact, and the source region, channel region, and drain region may be stacked vertically on the source contact or drain contact. Alternatively, a metal-assisted semiconductor growth process may be used to form a single crystal semiconductor material on a dielectric material adjacent to the metal. The portion of the semiconductor material on the dielectric material may be used to form the transistor. Other embodiments may be described and claimed.

18 Claims, 10 Drawing Sheets

(51) Int. Cl.
*C30B 29/40* (2006.01)
*H01L 27/088* (2006.01)

(58) Field of Classification Search
CPC ............. H01L 29/7834; H01L 29/7841; H01L 29/78654; C30B 29/08
See application file for complete search history.

(56) References Cited

U.S. PATENT DOCUMENTS

| | | | |
|---|---|---|---|
| 2014/0117368 A1* | 5/2014 | Haensch | H01L 21/823814 257/66 |
| 2015/0162448 A1 | 6/2015 | Raghavan et al. | |
| 2015/0303313 A1* | 10/2015 | Mallela | H01L 29/0847 257/295 |
| 2019/0097064 A1* | 3/2019 | Leobandung | H01L 29/78696 |

OTHER PUBLICATIONS

International Preliminary Report on Patentability for International Patent Application No. PCT/US2017/068993 dated Jul. 9, 2020, 12 pgs.

* cited by examiner

METAL-ASSISTED SINGLE CRYSTAL TRANSISTORS

CROSS-REFERENCE TO RELATED APPLICATION

This patent application is a divisional of U.S. patent application Ser. No. 16/648,974, filed Mar. 19, 2020, which is a U.S. National Phase Application under 35 U.S.C. § 371 of International Application No. PCT/US2017/068993, filed Dec. 29, 2017, entitled "METAL-ASSISTED SINGLE CRYSTAL TRANSISTORS," which designates the United States of America, the entire disclosure of which are hereby incorporated by reference in their entirety and for all purposes.

TECHNICAL FIELD

Embodiments of the disclosure are in the field of integrated circuits and, in particular, to metal-assisted transistors.

BACKGROUND

Traditional three-dimensional (3D) integrated circuits are created by interconnecting wafers and/or dies vertically using through-silicon vias (TSVs). The 3D integrated circuits enable performance improvements at reduced power and smaller footprint than conventional two-dimensional processes. However, prior techniques are costly and complicate process integration.

DESCRIPTION OF THE EMBODIMENTS

Figure 1:
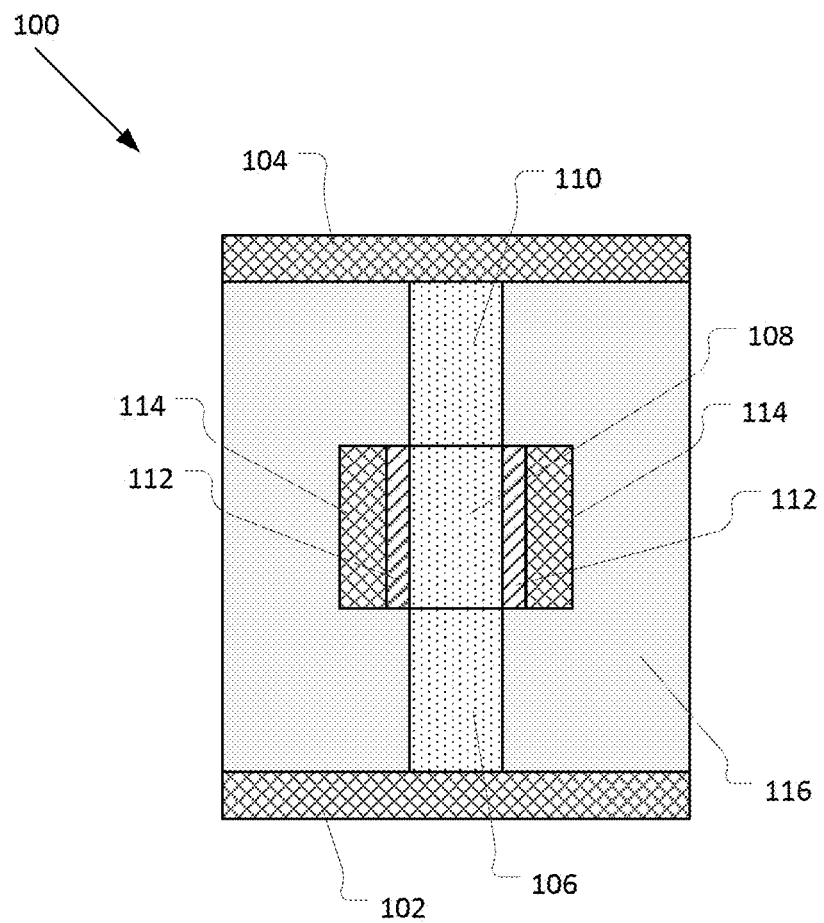
FIG. 1 schematically illustrates a cross-sectional side view of a metal-assisted transistor, in accordance with various embodiments.

Described herein are metal-assisted transistors (e.g., metal-assisted single crystal transistors), and associated methods, apparatuses, and systems. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Various embodiments described herein are directed to a metal-assisted transistor. The metal-assisted transistor may be formed in the BEOL. The metal-assisted transistor may include a single crystalline semiconductor material to form the channel region. As used herein, the term "single crystalline semiconductor material" means a semiconductor material that includes a substantially continuous crystal lattice. The single crystalline semiconductor material may include negligible or very few grain boundaries.

In some embodiments, the channel region, source region, and or drain region of the metal-assisted transistor may be formed by metal-assisted single crystal epitaxy growth. The channel region, source region, and/or drain region may have a continuous crystal structure over the dimensions of the respective regions. The semiconductor material may be seeded off the metal to form single crystals. In some embodiments, the single crystal semiconductor material may first grow in an axial manner until its length exceeds the diffusion length of adatoms incoming from the substrate, at which point sidewall nucleation gets triggered, resulting in a shell expanding radially. The metal may be a sacrificial material or may be present in the final device. For example, in some embodiments, the metal that is used for seeding the single crystal semiconductor material may form the source contact or drain contact of the vertically integrated transistor.

The semiconductor material formed by metal-assisted epitaxy growth may include any suitable semiconductor material, such as germanium, silicon, a III-V material (e.g., including indium, gallium, arsenide, phosphorus, and/or antimony, etc.), and/or a compound semiconductor including more than one element (e.g., germanium in combination with one or more other elements; indium, gallium, and arsenide (e.g., InGaAs), indium and phosphorus (e.g., InP), gallium and antimony (e.g., GaSb), indium and antimony (e.g., InSb), and/or gallium and nitrogen (e.g., GaN)).

In some embodiments, the source region, channel region, and drain region may be oriented vertically. For example, the channel region may be on one of the source region or drain region, and the other of the source region or drain region may be on the channel region. In some such embodiments, the source region, channel region, and drain region may be seeded from a metal that corresponds to the contact for the source region or drain region that is on the bottom of the stack.

In other embodiments, the source region, channel region, and drain region may be oriented horizontally. For example, a metal trench or via may be formed in an ILD layer, with a dielectric material adjacent to the metal. In some embodiments, a top surface of the metal in the trench or via may be recessed from a top surface of the adjacent dielectric material. The semiconductor material (e.g., single crystal semiconductor material) may be grown on (e.g., seeded from) the metal, and may grow horizontally over the adjacent dielectric material. The semiconductor material over the metal (and, in some embodiments, the metal) may then be removed, leaving the portion of semiconductor material on the dielectric material. Further processing may then be performed to form a transistor from the semiconductor material on the dielectric material. The further processing may include, for example, doping the source region, drain region, and/or channel region, forming a gate dielectric layer and/or one or more additional layers, and/or forming a source contact, a drain contact, and/or a gate contact.

Figure 2:
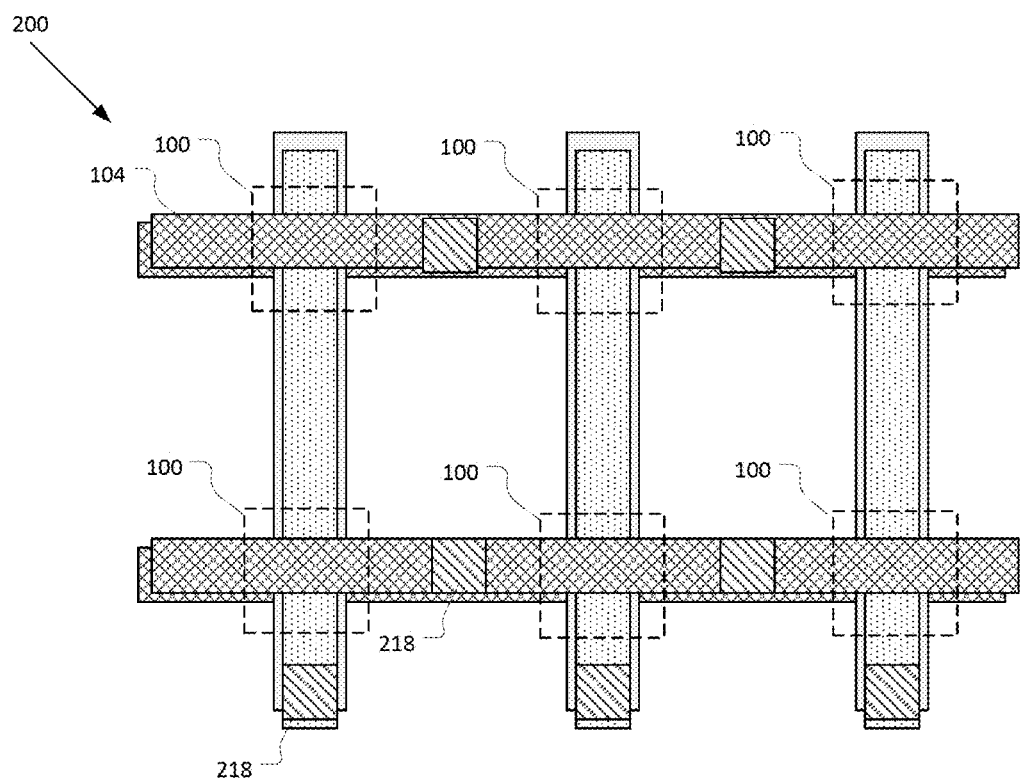
FIG. 2 schematically illustrates a top-down view of an integrated circuit (IC) structure including a plurality of the metal-assisted transistors of FIG. 1, in accordance with various embodiments.

FIG. 1 illustrates a cross-sectional side view of transistor 100 (e.g., a metal-assisted single crystal transistor 100) in accordance with various embodiments. FIG. 2 illustrates a top-down view of an IC structure 200 including a plurality of transistors 100. Transistor 100 includes a source contact 102 and a drain contact 104 above the source contact 102. A source region 106, channel region 108, and drain region 110 are vertically arranged between the source contact 102 and the drain contact 104 (e.g., with source region 106 on the source contact 102, the channel region 108 on the source region 106, the drain region 110 on the channel region 108, and the drain contact 104 on the drain region 110). Although FIG. 1 depicts the source region 106 below the channel region 108 and the drain region 110 above the channel region, it will be apparent that other embodiments of the transistor 100 may have the drain region below the channel region and the source region above the channel region.

In some embodiments, the transistor 100 may be formed on an IC die that includes a substrate. By "vertically arranged," it is meant that a reference line connecting the source contact 102 to the drain contact 104 through the source region, 106, channel region 108, and drain region 110 is orthogonal to a plane of the substrate.

A gate dielectric 112 may be adjacent a side surface of the channel region 108, and a gate contact 114 may be adjacent the gate dielectric 112 (e.g., with the gate dielectric 112 between the gate contact 114 and the channel region 108). In some embodiments, the gate dielectric 112 may be in direct contact with the channel region 108 and/or the gate contact 114. In other embodiments, one or more additional materials may be disposed between the gate dielectric 112 and the channel region 108 and/or between the gate dielectric 112 and the gate contact 114.

A dielectric material 116 (e.g., ILD) may be adjacent the source region 106, drain region 110, and/or gate contact 114. For example, in some embodiments, the source contact 102 and/or drain contact 104 may extend laterally past the respective source region 106 and/or drain region 110, and the dielectric material 116 may be between and in contact with the source contact 102 and drain contact 104.

In various embodiments, the source region 106, channel region, 108, and/or drain region 110 may be formed by metal-assisted semiconductor growth on the source contact 102. The source region 106, channel region 108, and/or drain region 110 may include any suitable semiconductor material, such as germanium, silicon, a III-V semiconductor, and/or a compound semiconductor material including more than one semiconductor. In some embodiments, the semiconductor material may be a compound semiconductor including germanium, for example, germanium and silicon.

In various embodiments, the metal-assisted semiconductor growth may be performed epitaxially (e.g., using chemical vapor deposition). The metal-assisted semiconductor growth may produce a single crystal semiconductor material for the source region 106, channel region 108, and/or drain region 110. The single crystal semiconductor material may provide performance benefits, such as lower leakage current, particularly for low bandgap semiconductor materials such as germanium and III-V materials. These low bandgap materials typically have high gate-to drain overlap and high electric field, leading to tunneling at the gate-drain interface which creates a high leakage current (e.g., $I_{off}$, the current through the channel region when the transistor is off). In contrast, the single crystal semiconductor material in the transistor 100 described herein reduces tunneling at the gate-drain interface (e.g., gate-induced drain leakage (GIDL). Additionally, the metal-assisted semiconductor growth process described herein enables the materials of the source region 106 and/or drain region 110 to be tailored to reduce leakage current. Furthermore, the transistor 100 may enable increased separation between the gate and the drain or source, thereby further reducing the gate-induced drain leakage (GIDL) for PMOS and NMOS transistors, respectively.

An advantage of vertical epitaxial growth is that the source and drain are grown at different times. This allows the channel-drain interface to be engineered to reduce GIDL-limited $I_{off}$ particularly for low bandgap channel semiconductors like germanium or III-V semiconductors. This can be achieved either by increased separation between the gate and drain or by introducing a wide bandgap cap layer between channel and drain to reduce tunneling and hence GIDL.

In some embodiments, the doping of the source region 106, channel region 108, and/or drain region 110 may be different from one another. For example, the doping may be performed epitaxially as part of the metal-assisted semiconductor growth process. In some embodiments, the doping properties may be varied during the growth process as the process transitions from forming the source region 106 to the channel region 108 and/or from forming the channel region 108 to the drain region 110. In other embodiments, the semiconductor material may be grown first with the doping properties desired for the source region 106 (e.g., up to the level of the drain contact 104). The semiconductor material may then be recessed and growth may be continued using the doping properties desired for the channel region 108. A second recess may be performed on the semiconductor material of the channel region 108, and then growth may be continued using the doping properties desired for the drain region 110. This process may enable more precise control over the dimensions and/or location of the source region 106, channel region 108, and/or drain region 110 compared to varying the doping properties within one continuous epitaxial growth process, however at the cost of increased process complexity and material use.

Additionally, or alternatively, the source region 106, channel region 108, and/or drain region 110 may be formed of different materials or the same material. In some embodiments, a cap layer may be formed between the channel region 108 and the drain region 110. The cap layer may be a different material than the channel region 108. For example, the material of the cap layer may have a wider bandgap than the material of the channel region 108.

The source contact 102, drain contact 104, and/or gate contact 114 (also referred to as electrodes) may be formed of one or more metals or other conductive materials as described above, including, but not limited to, copper, cobalt, gold, silver, tantalum, etc. The gate dielectric 112 and/or dielectric material 116 may include any suitable dielectric material as described above. The gate dielectric 112 may have the same material composition or a different material composition from the dielectric material 116.

FIG. 2 illustrates a top-down view of an IC structure 200 including a plurality of transistors 100. As shown, the source contact 102 and drain contact 104 are parallel to one another. The gate contact 114 extends orthogonal to the source contact 102 and drain contact 104. In some embodiments, the dielectric material 116 may also extend parallel go the gate contact 114. The dielectric material 116 may additionally be present between the transistors 100 of the IC structure 200. Vias 218 may be used to provide electrical connections to the source contact 102, drain contact 104, and/or gate contact 114.

As discussed above, in other embodiments, the metal-assisted semiconductor growth process may be performed on metal in a trench and the semiconductor may be grown to extend laterally over an adjacent dielectric. The portion of the semiconductor material (e.g., single crystal semiconductor) on the dielectric may be used to form one or more transistors. For example, the transistors may be thin-film transistors (TFTs). The transistors formed by this process may be BEOL transistors. The single crystal semiconductor material may provide the transistors with reduced leakage current (e.g., $I_{off}$).

FIGS. 3A, 3C, 3E, and 3G illustrate top-down views, and FIGS. 3B, 3D, 3F, and 3H illustrate cross-sectional side views, of an IC structure 300 at various stages of a transistor fabrication process that uses lateral metal-assisted semiconductor growth to form a semiconductor material on a dielectric material, in accordance with various embodiments.

Figures 3A, 3B:
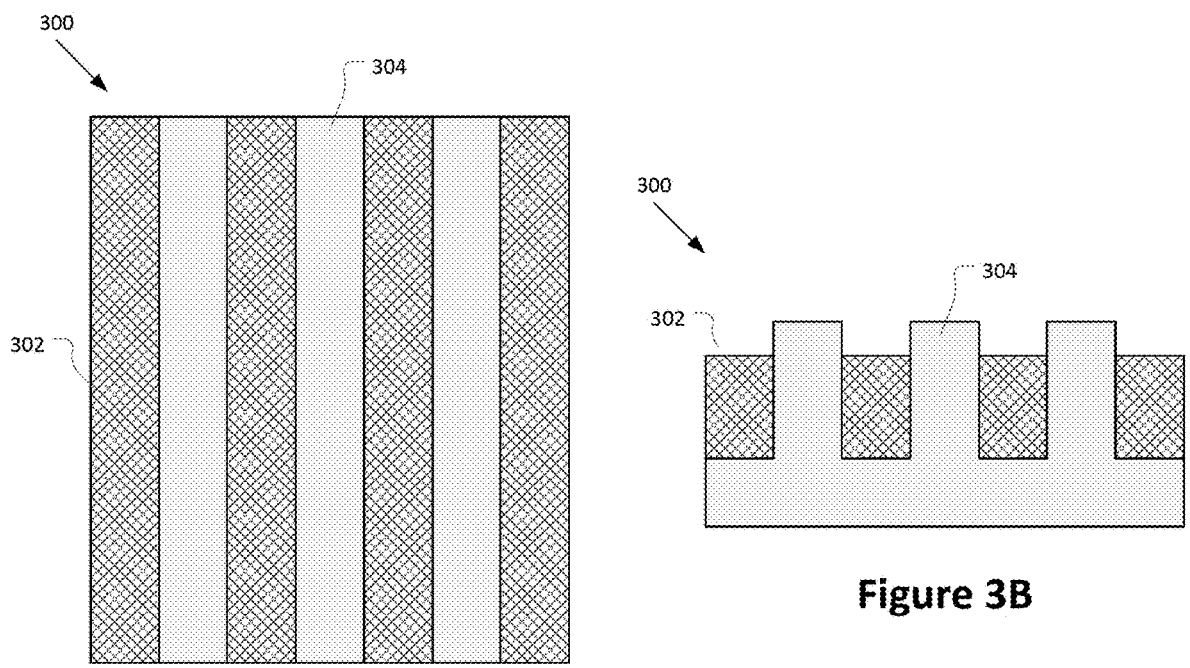
FIGS. 3A, 3C, 3E, and 3G illustrate top-down views.
FIGS. 3B, 3D, 3F, and 3H illustrate cross-sectional side views, of an IC structure 300 at various stages of a transistor fabrication process that uses lateral metal-assisted semiconductor growth to form a semiconductor material on a dielectric material, in accordance with various embodiments.

FIGS. 3A and 3B illustrate metal lines 302 formed in a dielectric layer 304. For example, the metal lines 302 may be formed as trenches in the dielectric layer 304. In some embodiments, a top surface of the metal lines 302 may be below (e.g., recessed) a top surface of the dielectric layer 304. In other embodiments, the top surface of the metal lines 302 may be substantially even with the top surface of the dielectric layer 304. The dielectric layer 304 and metal lines 302 may be in BEOL layers of an IC die (e.g., in a metal layer ($M_x$) above FEOL devices, such as FEOL transistors). The dimensions and/or pitch of the trenches in the dielectric layer 304 may be selected to provide the desired dimensions of and spacing between the transistors that will be formed on the dielectric layer 304 between the trenches, as further described below.

Figure 3C:
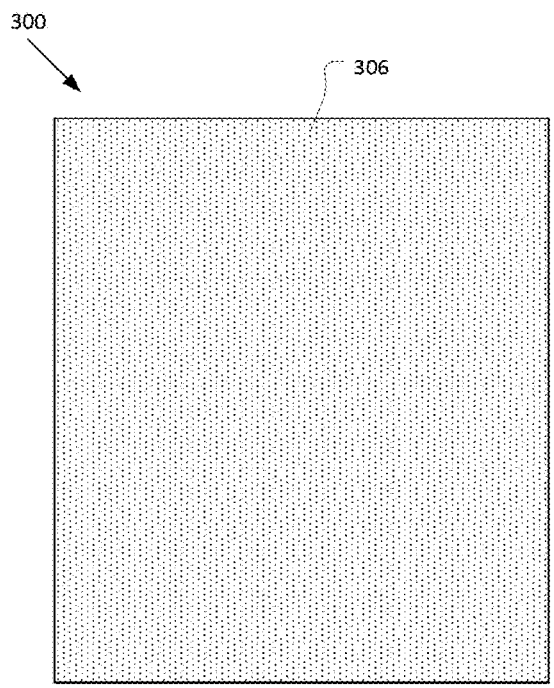
Figure 3D:
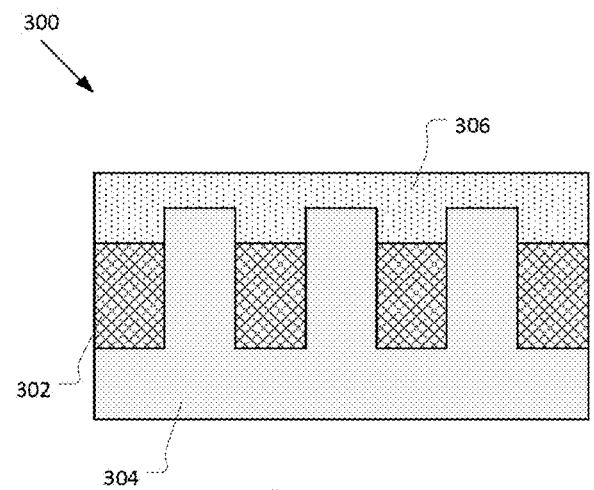

As shown in FIGS. 3C and 3D, a semiconductor material 306 may be formed on the metal lines 302 and laterally over the dielectric layer 304. The semiconductor material 306 may be formed by metal-assisted epitaxial growth, as discussed herein. Accordingly, the semiconductor material 306 may be a single crystal semiconductor material. The semiconductor material may include any suitable material, such as germanium, silicon, a III-V material, and/or a composite semiconductor material as discussed herein.

In some embodiments, the metal lines 302 may be formed with a liner in the trenches. The liner material may also be formed on the top surface of the dielectric layer 304. In these embodiments, the liner material may be removed from the top surface of the dielectric layer 304 after formation of the metal lines 302 and before the semiconductor material 306 is seeded from the metal lines 302.

Figure 3E:
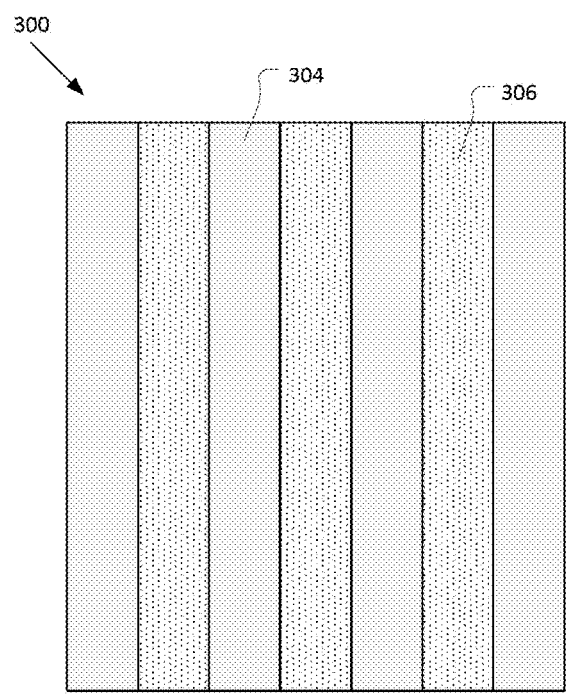
Figure 3F:
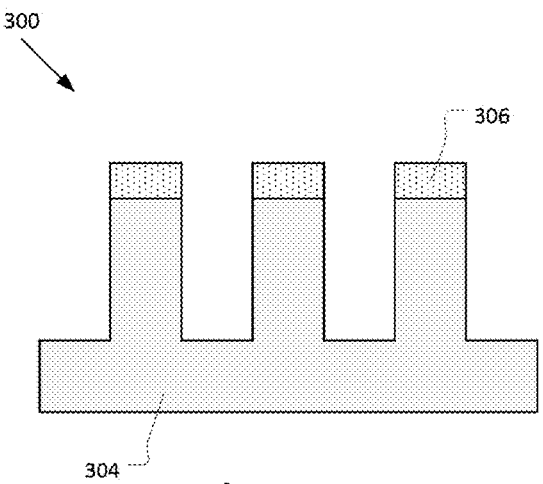

As shown in FIGS. 3E and 3F, the semiconductor material 306 that is over the metal lines 302 may be removed, leaving the semiconductor material 306 that are on the dielectric layer 304. In some embodiments, the metal lines 302 may also be removed. Accordingly, the metal lines 302 may be sacrificial metal lines used to form the metal-assisted semiconductor material 306. The semiconductor material 306 that is on the metal lines 302 may be removed by any suitable process, such as a selective etch process.

In some embodiments, a top surface of the semiconductor material 306 may be polished to planarize the top surface of the semiconductor material 306 prior to removing the semiconductor material 306 that is on the metal lines 302.

Figure 3G:
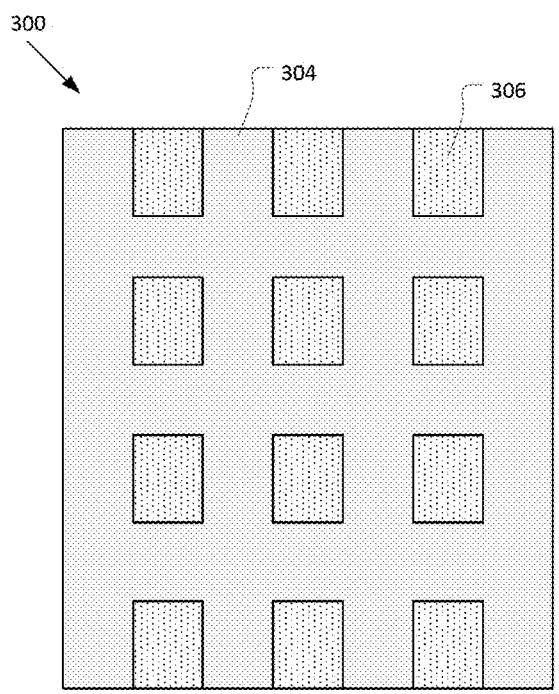
Figure 3H:
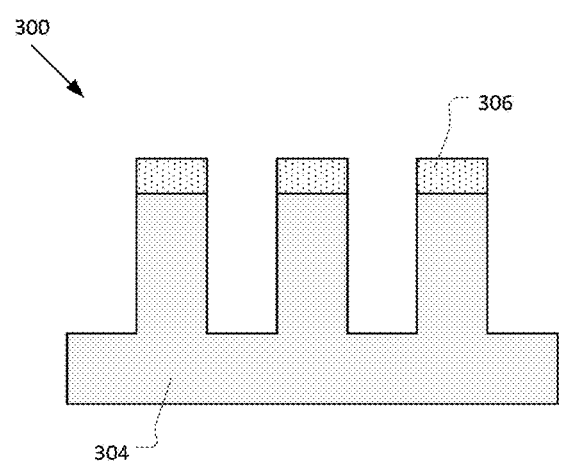

As shown in FIGS. 3G and 3H, portions of the semiconductor material 306 that is on the dielectric layer 304 may be removed, thereby leaving portions of the semiconductor material that are separated from one another. Further processing may be performed on the portions of the semiconductor material 306 to form transistors (e.g., TFTs) using the portions of the semiconductor material 306. For example, the semiconductor material 306 may form the channel region, source region, and/or drain region of the transistor. The further processing may include, for example, doping the source region, drain region, and/or channel region, forming a gate dielectric layer and/or one or more additional layers, and/or forming a source contact, a drain contact, and/or a gate contact. Additionally, or alternatively, the trenches in which the metal 302 was located may be filled in (e.g., by a dielectric material that may be the same material or a different material from the dielectric layer 304).

In some embodiments, a gate dielectric material (not shown) may be blanket deposited on the semiconductor material 306 prior to removing the gate dielectric material and the semiconductor material 306 that are over the metal lines 302 and/or prior to removing the portions of the semiconductor material 306 that is on the dielectric layer 304. The gate dielectric material may be used as a gate dielectric layer in the transistors that are formed using the remaining portions of the semiconductor material 306 on the dielectric layer 304. For example, the gate dielectric material may correspond to the gate dielectric 412 of transistor 400 depicted in FIG. 4.

Figure 4:
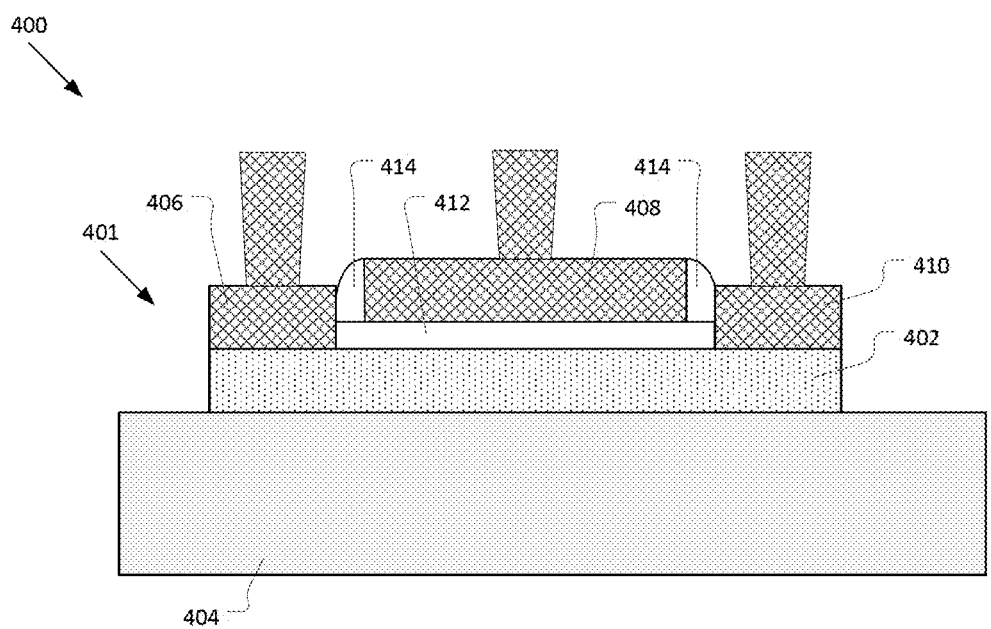
FIG. 4 illustrates a cross-sectional side view of an IC structure including a metal-assisted transistor that may be formed according to the process described with respect to FIGS. 3A-3H, in accordance with some embodiments.

FIG. 4 illustrates a side cross-sectional view of an IC structure 400 including a transistor 401 that may be formed according to the process illustrated and described with respect to FIGS. 3A-3H, in accordance with various embodiments. The transistor 400 may be a TFT and/or may be formed in BEOL.

In various embodiments, the transistor 401 may include a semiconductor material 402 on a dielectric material 404. In some embodiments, the semiconductor material 402 may correspond to the semiconductor material 306 in FIGS. 3G and 3H, and/or the dielectric material 404 may correspond to the dielectric layer 304 of FIGS. 3G and 3H. The semiconductor material 402 may be formed by the metal-assisted semiconductor growth process described herein. For example, the semiconductor material 402 may be seeded from a metal trench in the dielectric material 404 and grown laterally on to the surface of the dielectric material 404.

The transistor 401 may further include a source contact 406, a gate contact 408, and a drain contact 410 over the semiconductor material 402. A gate dielectric 412 may be disposed between the gate contact 408 and the semiconductor material 402. Sidewall spacers 414 may be disposed between the gate contact 408 and the source contact 406 and/or between the gate contact 408 and the drain contact 410. The sidewall spacers may include any suitable material, such as a dielectric material.

In various embodiments, the IC structure 400 may further include one or more vias 416 to provide electrical connections for the source contact 406, gate contact 408, and/or drain contact 410. The transistor 401 may be a BEOL transistor. One or more metal layers (e.g., interconnect layers) may be disposed above and/or below the transistor 401.

In various embodiments, the apparatuses described herein (e.g., the transistor 100, the IC structure 200, the IC structure 300, the IC structure 400 and/or the transistor 401) may be formed on a respective dies of a wafer. For example, FIGS. 5 and 6 are top views of a wafer and dies that include one or more metal-assisted transistors, in accordance with any of the embodiments disclosed herein.

Figure 5:
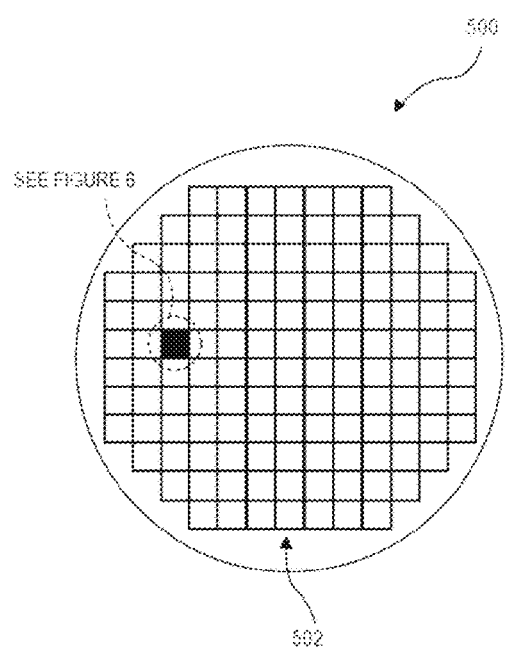
FIGS. 5 and 6 are top views of a wafer and dies that include one or more metal-assisted transistors, in accordance with one or more of the embodiments disclosed herein.
Figure 6:
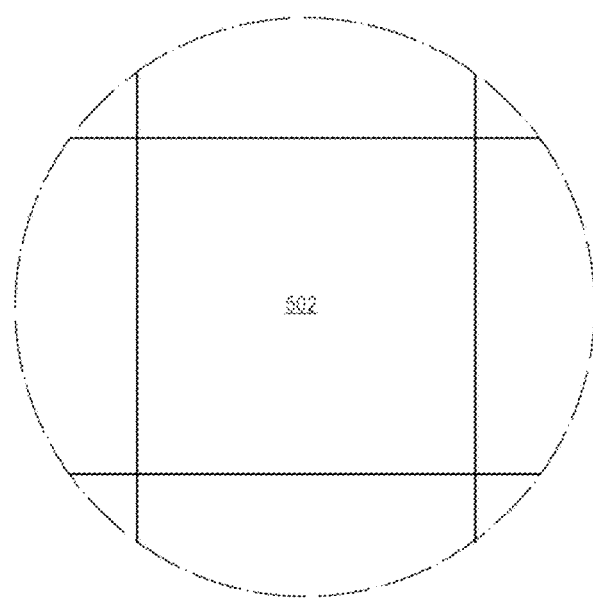

Referring to FIGS. 5 and 6, a wafer 500 may be composed of semiconductor material and may include one or more dies 502 having IC structures formed on a surface of the wafer 500. Each of the dies 502 may be a repeating unit of a semiconductor product that includes any suitable IC (e.g., the transistor 100, the IC structure 200, the IC structure 300, the IC structure 400 and/or the transistor 401). After the fabrication of the semiconductor product is complete, the wafer 500 may undergo a singulation process in which each of the dies 502 is separated from one another to provide discrete "chips" of the semiconductor product. In particular, devices that include one or more metal-assisted transistors as disclosed herein may take the form of the wafer 500 (e.g., not singulated) or the form of the die 502 (e.g., singulated). The die 502 may include one or more transistors and/or supporting circuitry to route electrical signals to the transistors, as well as any other IC components. In some embodiments, the wafer 500 or the die 502 may include a memory device (e.g., a static random access memory (SRAM) device), a logic device (e.g., an AND, OR, NAND, or NOR gate), or any other suitable circuit element. Multiple ones of these devices may be combined on a single die 502. For example, a memory array formed by multiple memory devices may be formed on a same die 502 as a processing device or other logic that is configured to store information in the memory devices or execute instructions stored in the memory array.

Figure 7:
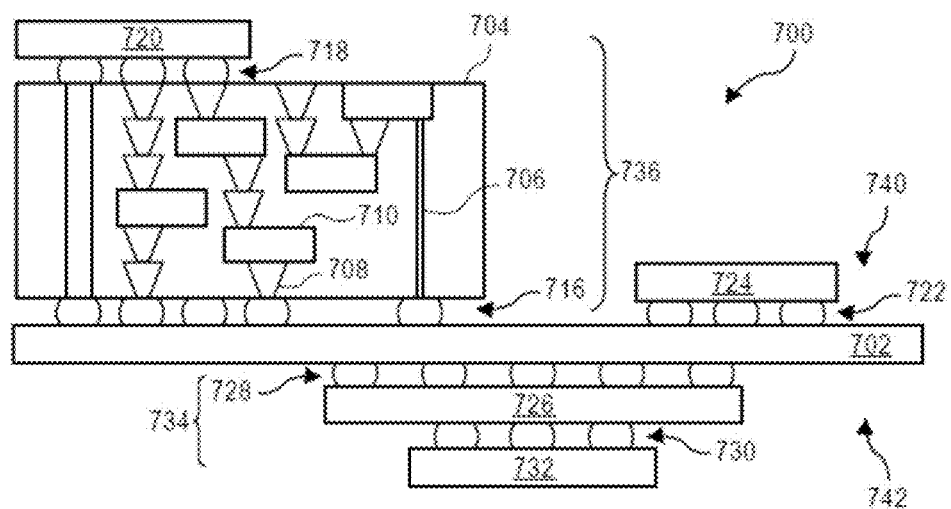
FIG. 7 is a cross-sectional side view of an integrated circuit (IC) device assembly that may include one or more metal-assisted transistors, in accordance with one or more of the embodiments disclosed herein.

FIG. 7 is a cross-sectional side view of an integrated circuit (IC) device assembly 700 that may include one or more metal-assisted transistors, in accordance with one or more of the embodiments disclosed herein.

The IC device assembly 700 includes a number of components disposed on a circuit board 702 (which may be, e.g., a motherboard). The IC device assembly 700 includes components disposed on a first face 740 of the circuit board 702 and an opposing second face 742 of the circuit board 702. Generally, components may be disposed on one or both faces 740 and 742. In particular, any suitable ones of the components of the IC device assembly 700 may include one or more of the metal-assisted transistors and/or IC structures disclosed herein (e.g., the transistor 100, the IC structure 200, the IC structure 300, the IC structure 400 and/or the transistor 401).

In some embodiments, the circuit board 702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 702. In other embodiments, the circuit board 702 may be a non-PCB substrate.

The IC device assembly 700 illustrated in FIG. 7 includes a package-on-interposer structure 736 coupled to the first face 740 of the circuit board 702 by coupling components 716. The coupling components 716 may electrically and mechanically couple the package-on-interposer structure 736 to the circuit board 702, and may include solder balls (as shown in FIG. 7), male and female portions of a socket, an adhesive, an underfill material, and/or any other suitable electrical and/or mechanical coupling structure.

The package-on-interposer structure 736 may include an IC package 720 coupled to an interposer 704 by coupling components 718. The coupling components 718 may take any suitable form for the application, such as the forms discussed above with reference to the coupling components 716. Although a single IC package 720 is shown in FIG. 7, multiple IC packages may be coupled to the interposer 704. It is to be appreciated that additional interposers may be coupled to the interposer 704. The interposer 704 may provide an intervening substrate used to bridge the circuit board 702 and the IC package 720. The IC package 720 may be or include, for example, a die (the die 502 of FIG. 6), an IC device (e.g., the IC device 400 of FIG. 4), or any other suitable component. Generally, the interposer 704 may spread a connection to a wider pitch or reroute a connection to a different connection. For example, the interposer 704 may couple the IC package 720 (e.g., a die) to a ball grid array (BGA) of the coupling components 716 for coupling to the circuit board 702. In the embodiment illustrated in FIG. 7, the IC package 720 and the circuit board 702 are attached to opposing sides of the interposer 704. In other embodiments, the IC package 720 and the circuit board 702 may be attached to a same side of the interposer 704. In some embodiments, three or more components may be interconnected by way of the interposer 704.

The interposer 704 may be formed of an epoxy resin, a fiberglass-reinforced epoxy resin, a ceramic material, or a polymer material such as polyimide. In some implementations, the interposer 704 may be formed of alternate rigid or flexible materials that may include the same materials described above for use in a semiconductor substrate, such as silicon, germanium, and other group III-V and group IV materials. The interposer 704 may include metal interconnects 708 and vias 710, including but not limited to through-silicon vias (TSVs) 706. The interposer 704 may further include embedded devices 714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 704. The package-on-interposer structure 736 may take the form of any of the package-on-interposer structures known in the art.

The IC device assembly 700 may include an IC package 724 coupled to the first face 740 of the circuit board 702 by coupling components 722. The coupling components 722 may take the form of any of the embodiments discussed above with reference to the coupling components 716, and the IC package 724 may take the form of any of the embodiments discussed above with reference to the IC package 720.

The IC device assembly 700 illustrated in FIG. 7 includes a package-on-package structure 734 coupled to the second face 742 of the circuit board 702 by coupling components 728. The package-on-package structure 734 may include an IC package 726 and an IC package 732 coupled together by coupling components 730 such that the IC package 726 is disposed between the circuit board 702 and the IC package 732. The coupling components 728 and 730 may take the form of any of the embodiments of the coupling components 716 discussed above, and the IC packages 726 and 732 may take the form of any of the embodiments of the IC package 720 discussed above. The package-on-package structure 734 may be configured in accordance with any of the package-on-package structures known in the art.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
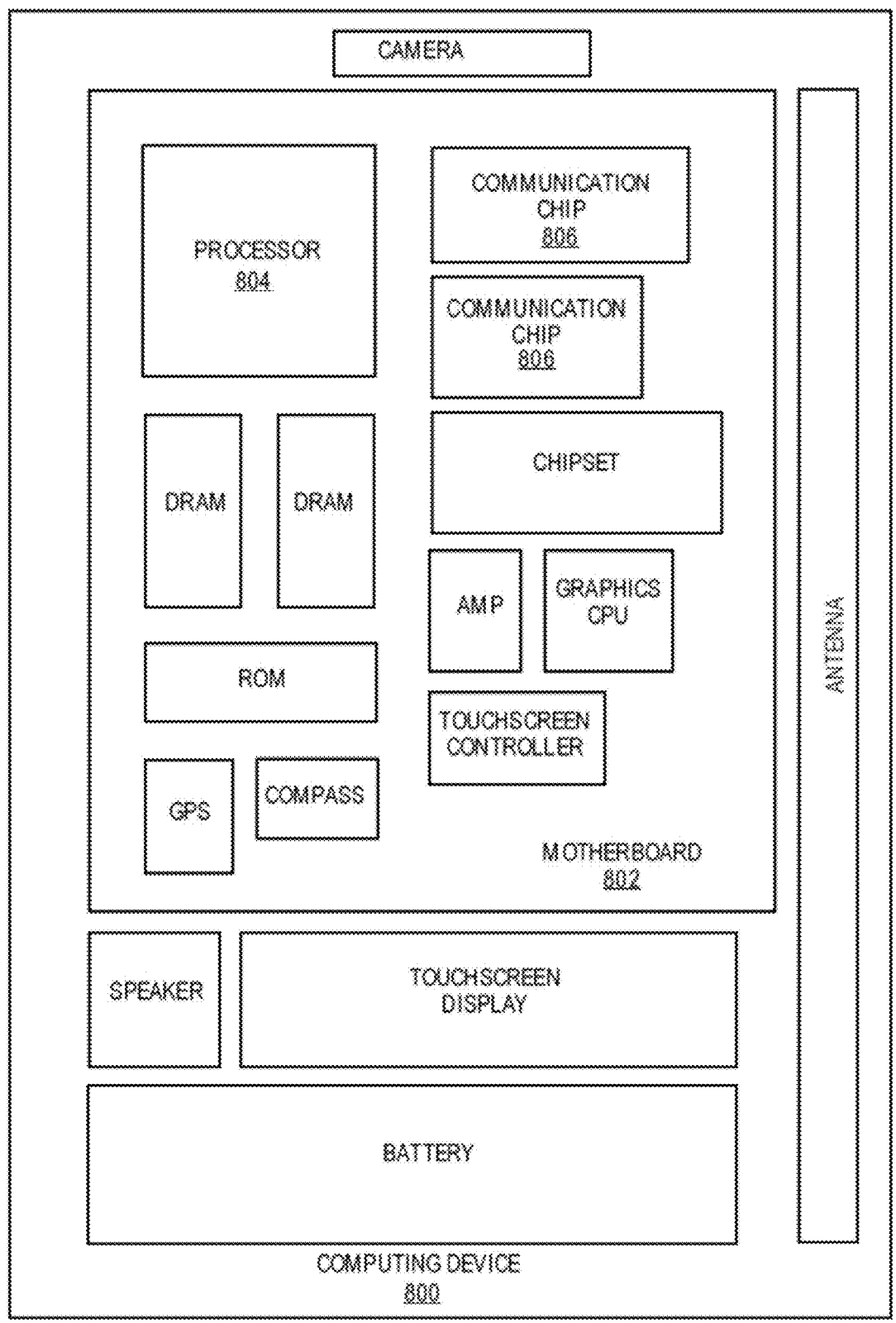
FIG. 8 illustrates a computing device in accordance with one implementation of an embodiment of the disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the disclosure, the integrated circuit die of the processor includes one or more metal-assisted transistors and/or IC structures (e.g., the transistor 100, the IC structure 200, the IC structure 300, the IC structure 400 and/or the transistor 401), in accordance with implementations of embodiments of the disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of embodiments of the disclosure, the integrated circuit die of the communication chip includes one or more metal-assisted transistors and/or IC structures (e.g., the transistor 100, the IC structure 200, the IC structure 300, the IC structure 400 and/or the transistor 401), in accordance with implementations of embodiments of the disclosure.

In further implementations, another component housed within the computing device 800 may contain an integrated circuit die that includes one or more metal-assisted transistors and/or IC structures (e.g., the transistor 100, the IC structure 200, the IC structure 300, the IC structure 400 and/or the transistor 401), in accordance with implementations of embodiments of the disclosure.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Some non-limiting Examples of various embodiments are provided below.

Example 1 is a transistor comprising: a first contact that corresponds to a first one of a source contact or a drain contact; a first region on the first contact, wherein the first region corresponds to a first one of a source region or a drain region; a channel region on the first region; a second region on the channel region, wherein the second region corresponds to a second one of a source region or a drain region; and a second contact on the second region, wherein the second contact corresponds to a second one of a source contact or a drain contact; wherein the first region, the channel region, and the second region are single crystalline semiconductor materials.

Example 2 is the transistor of Example 1, wherein the transistor further includes: a gate dielectric adjacent the channel region; and a gate contact adjacent the gate dielectric.

Example 3 is the transistor of Example 2, further comprising a dielectric material adjacent the gate contact and between the first contact and the second contact.

Example 4 is the transistor of Example 1, wherein the single crystalline semiconductor materials include germanium or a III-V material.

Example 5 is the transistor of Example 1, wherein the first region, the channel region, and the second region have different doping properties.

Example 6 is the transistor of Example 1, wherein a long axis of the gate contact is orthogonal to long axes of the first contact and the second contact.

Example 7 is the transistor of Example 6, wherein the gate contact is shared by one or more other transistors.

Example 8 is the transistor of any one of Examples 1 to 7, wherein the transistor is a back-end-of-line transistor.

Example 9 is a back-end-of-line (BEOL) transistor comprising: a dielectric material; a single crystalline semiconductor material on the dielectric material, the single crystalline semiconductor material to form a channel region of the BEOL transistor; and a source contact, a drain contact, and a gate contact over the single crystalline semiconductor material.

Example 10 is the BEOL transistor of Example 9, further comprising a gate dielectric between the gate contact and the single crystalline semiconductor material.

Example 11 is the BEOL transistor of Example 9, further comprising a dielectric material between the gate contact and the source contact and between the gate contact and the drain contact.

Example 12 is the BEOL transistor of Example 9, wherein the single crystalline semiconductor material further forms a source region and a drain region of the BEOL transistor.

Example 13 is the BEOL transistor of any one of Examples 9 to 12, wherein the single crystalline semiconductor material includes germanium or a III-V material.

Example 14 is a method for fabricating a back-end-of-line (BEOL) transistor, the method comprising: forming a metal in an interlayer dielectric (ILD); growing a semiconductor material on the metal by metal-assisted epitaxy to cause the semiconductor material to form on the ILD; removing a first portion of the semiconductor material that is on the metal to leave a second portion of the semiconductor material that is on the ILD; and forming the BEOL transistor using the second portion of the semiconductor material that is on the ILD.

Example 15 is the method of Example 14, wherein the semiconductor material is a single crystalline semiconductor material.

Example 16 is the method of Example 15, wherein the single crystalline semiconductor material includes germanium or a III-V material.

Example 17 is the method of Example 14, wherein forming the metal in the ILD includes forming the metal as a trench in the ILD with a top surface of the metal lower than a top surface of the ILD.

Example 18 is the method of any one of Examples 14 to 17, wherein forming the BEOL transistor includes forming a source contact, a gate contact, and a drain contact above the second portion of the semiconductor material.

Example 19 is a computer system comprising: a circuit board; and an integrated circuit (IC) die coupled to the circuit board, the IC die including an array of back-end-of-line (BEOL) transistors. Individual BEOL transistors of the array of BEOL transistors include: a first contact that corresponds to a first one of a source contact or a drain contact; a first region on the first contact, wherein the first region corresponds to a first one of a source region or a drain region; a channel region on the first region; a second region on the channel region, wherein the second region corresponds to a second one of a source region or a drain region; and a second contact on the second region, wherein the second contact corresponds to a second one of a source contact or a drain contact; wherein the first region, the channel region, and the second region are single crystalline semiconductor materials.

Example 20 is the computer system of Example 19, wherein the individual BEOL transistors further include: a gate dielectric adjacent the channel region; and a gate contact adjacent the gate dielectric.

Example 21 is the computer system of Example 19, wherein the single crystalline semiconductor materials include germanium or a III-V material.

Example 22 is the computer system of Example 19, wherein the first region, the channel region, and the second region have different doping properties.

Example 23 is the computer system of Example 19, wherein a long axis of the gate contact is orthogonal to long axes of the first contact and the second contact.

Example 24 is the computer system of Example 23, wherein the gate contact is shared by a plurality of the individual BEOL transistors.

Example 25 is the computer system of any one of Examples 19 to 24, further comprising one or more of an antenna, a display, a network adapter, or a memory device coupled to the IC die.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

What is claimed is:

1. A method for fabricating a back-end-of-line (BEOL) transistor, the method comprising:
   forming a metal in an interlayer dielectric (ILD);
   growing a semiconductor material on the metal by metal-assisted epitaxy to cause the semiconductor material to form on the ILD;
   removing a first portion of the semiconductor material that is on the metal to leave a second portion of the semiconductor material that is on the ILD; and
   forming the BEOL transistor using the second portion of the semiconductor material that is on the ILD.

2. The method of claim 1, wherein the semiconductor material is a single crystalline semiconductor material.

3. The method of claim 2, wherein the single crystalline semiconductor material includes germanium or a III-V material.

4. The method of claim 1, wherein forming the metal in the ILD includes forming the metal as a trench in the ILD with a top surface of the metal lower than a top surface of the ILD.

5. The method of claim 1, wherein the second portion includes:
   a first region that corresponds to a first one of a source region or a drain region of the BEOL transistor;
   a second region that corresponds to a second one of a source region or a drain region of the BEOL transistor; and
   a channel region between the first region and the second region.

6. The method of claim 5, wherein the semiconductor material in the second portion is a single crystalline semiconductor material with a substantially continuous crystalline structure through the first region, the channel region, and the second region.

7. The method of claim 5, wherein forming the BEOL transistor includes forming a source contact, a gate contact, and a drain contact over the second portion.

8. The method of claim 7, further comprising forming a gate dielectric on the channel region, wherein the gate contact is formed on the gate dielectric.

9. The method of claim 8, further comprising forming a dielectric material adjacent the gate contact and between the source contact and the drain contact.

10. The method of claim 5, wherein the first region, the channel region, and the second region have different doping properties.

11. A method for fabricating a transistor, the method comprising:
    forming a first contact that corresponds to one of a source contact or a drain contact, wherein the first contact includes a metal;
    growing a semiconductor material on the first contact by metal-assisted epitaxy, wherein the semiconductor material includes a first region on the first contact, a channel region on the first region, and a second region on the channel region, wherein the first region corresponds to a first one of a source region or a drain region, wherein the second region corresponds to a second one of the source region or the drain region, and wherein the semiconductor material is a single crystalline semiconductor material with a substantially continuous crystalline structure through the first region, the channel region, and the second region; and
    forming a second contact on the second region of the semiconductor material, wherein the second contact corresponds to a second one of the source contact or the drain contact.

12. The method of claim 11, further comprising:
    forming a gate dielectric adjacent the channel region; and
    forming a gate contact adjacent the gate dielectric.

13. The method of claim 12, further comprising forming a dielectric material adjacent the gate contact and between the first contact and the second contact.

14. The method of claim 12, wherein a long axis of the gate contact is orthogonal to long axes of the first contact and the second contact.

15. The method of claim 14, wherein the gate contact is shared by one or more other transistors.

16. The method of claim 11, wherein the semiconductor material includes germanium or a III-V material.

17. The method of claim 11, wherein the first region, the channel region, and the second region have different doping properties.

18. The method of claim 11, wherein the transistor is a back-end-of-line transistor.

* * * * *